US010743438B2

(12) United States Patent
Wakino et al.

(10) Patent No.: US 10,743,438 B2
(45) Date of Patent: Aug. 11, 2020

(54) LIQUID COOLING DEVICE, LIQUID COOLING SYSTEM, AND CONTROL METHOD OF LIQUID COOLING DEVICE

(71) Applicant: FUJITSU LIMITED, Kawasaki-shi, Kanagawa (JP)

(72) Inventors: Yukiko Wakino, Sagamihara (JP); Satoshi Inano, Minoh (JP); Hiroyuki Fukuda, Yokohama (JP); Hiroyoshi Kodama, Isehara (JP); Minoru Ishinabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 29 days.

(21) Appl. No.: 15/645,362

(22) Filed: Jul. 10, 2017

(65) Prior Publication Data

US 2018/0027695 A1 Jan. 25, 2018

(30) Foreign Application Priority Data

Jul. 25, 2016 (JP) .................................. 2016-145562

(51) Int. Cl.
*H05K 7/20* (2006.01)

(52) U.S. Cl.
CPC ..... *H05K 7/20236* (2013.01); *H05K 7/20272* (2013.01); *H05K 7/20772* (2013.01)

(58) Field of Classification Search
CPC ....... G06F 1/181–182; G06F 2200/201; G06F 1/20; H05K 7/20218–20381; H05K 7/20409–20418; H05K 7/20009–202; H05K 7/20236; H05K 7/20272; H05K 7/20772; H05K 7/20263; H05K 7/20281; H05K 7/20781; H05K 7/20763; H05K 7/203; H01L 23/367–3677; H01L 23/473; H01L 23/46–467; H01L 23/467

(Continued)

(56) References Cited

U.S. PATENT DOCUMENTS

| 4,993,480 A * | 2/1991 | Suzuki | ................... G01N 11/00 165/253 |
| 5,406,807 A * | 4/1995 | Ashiwake | ............. H01L 23/427 165/908 |

(Continued)

FOREIGN PATENT DOCUMENTS

| JP | 3-224256 A | 10/1991 |
| JP | 6-169039 | 6/1994 |
| JP | 2011-518395 | 6/2011 |

*Primary Examiner* — Adam B Dravininkas
(74) *Attorney, Agent, or Firm* — Xsensus LLP

(57) ABSTRACT

An apparatus includes: a cooling medium bath configured to house a first refrigerant in which an electronic device is immersed; a liquid-cooling jacket configured to be provided to the electronic device and to cool the electronic device by a second refrigerant that flows in an internal section of the liquid-cooling jacket; a first pipe coupled to the cooling medium bath, to be immersed in the first refrigerant, and configured to supply the second refrigerant from an outside of the cooling medium bath to the liquid-cooling jacket; a second pipe coupled to the cooling medium bath, to be immersed in the first refrigerant, and configured to discharge the second refrigerant that flows in the internal section of the liquid-cooling jacket to the outside of the cooling medium bath; and a circulator configured to cause the first refrigerant in the cooling medium bath to stream.

19 Claims, 6 Drawing Sheets

(58) Field of Classification Search
USPC ...... 361/676–678, 679.46–679.54, 688–723;
165/80.1–80.5, 104.33, 185;
174/15.1–15.3, 16.1–16.3, 547, 548;
257/712–722, E23.088; 24/453, 458–459;
454/184; 312/236
See application file for complete search history.

(56) References Cited

U.S. PATENT DOCUMENTS

| | | | | |
|---|---|---|---|---|
| 5,471,850 A * | 12/1995 | Cowans | ................... | F25B 1/10 165/80.4 |
| 5,491,363 A * | 2/1996 | Yoshikawa | ......... | H01L 23/4332 165/80.4 |
| 6,010,675 A * | 1/2000 | Trocciola | ............. | B01D 53/864 423/427 |
| 6,889,509 B1 * | 5/2005 | Cader | ................ | G01R 31/2874 165/104.33 |
| 7,826,217 B2 * | 11/2010 | Kondo | ..................... | G06F 1/20 165/104.21 |
| 7,921,829 B2 * | 4/2011 | Hayashi | .................... | F01P 3/02 123/41.31 |
| 8,014,150 B2 * | 9/2011 | Campbell | .......... | H05K 7/20809 361/700 |
| 8,508,934 B2 * | 8/2013 | Roering | .................... | G06F 1/20 165/104.19 |
| 9,689,588 B2 * | 6/2017 | Matsuura | .................. | F25B 1/10 |
| 9,933,170 B2 * | 4/2018 | Wong | ........................ | F24F 3/06 |
| 2003/0121651 A1 * | 7/2003 | Andersson | .......... | F28D 20/0052 165/206 |
| 2005/0069432 A1 * | 3/2005 | Tomioka | ................ | G06F 1/203 417/423.1 |
| 2005/0092468 A1 * | 5/2005 | Cheng | .................... | F28D 15/00 165/104.33 |
| 2006/0011332 A1 * | 1/2006 | Inoue | ................ | H05K 7/20927 165/166 |
| 2006/0021737 A1 * | 2/2006 | Lee | ....................... | H01L 23/473 165/80.4 |
| 2007/0089859 A1 * | 4/2007 | Wei | ....................... | H01L 23/467 165/80.4 |
| 2007/0227703 A1 * | 10/2007 | Bhatti | .................... | F28D 15/02 165/104.26 |
| 2008/0302505 A1 * | 12/2008 | Kato | .................... | F25B 23/006 165/61 |
| 2009/0001372 A1 * | 1/2009 | Arik | ........................ | C09K 5/10 257/58 |
| 2009/0034194 A1 * | 2/2009 | Chen | .................... | H01L 23/473 361/700 |
| 2009/0260777 A1 | 10/2009 | Attlesey | | |
| 2011/0048676 A1 * | 3/2011 | Toyoda | ................ | F28D 1/05366 165/104.21 |
| 2011/0262794 A1 * | 10/2011 | Yoon | .................... | H01M 10/486 429/120 |
| 2012/0097752 A1 * | 4/2012 | Okano | ................ | B01F 3/04978 239/1 |
| 2013/0025827 A1 * | 1/2013 | Su | ....................... | H05K 7/20745 165/104.25 |
| 2013/0083482 A1 * | 4/2013 | Uchida | ................. | H01L 23/427 361/696 |
| 2013/0091866 A1 * | 4/2013 | Campbell | ............... | F25B 21/02 62/3.2 |
| 2013/0105122 A1 * | 5/2013 | Campbell | .............. | H05K 7/203 165/104.26 |
| 2014/0158325 A1 * | 6/2014 | Gwin | ...................... | F28D 15/04 165/104.26 |
| 2014/0171306 A1 * | 6/2014 | Manabe | ............... | B01J 20/3078 502/437 |
| 2015/0087733 A1 * | 3/2015 | Heusser | ................ | B29C 47/366 521/79 |
| 2015/0245539 A1 * | 8/2015 | Pelletier | .................. | G06F 1/206 361/679.53 |
| 2015/0247679 A1 * | 9/2015 | Niimi | ....................... | F28D 15/00 165/61 |
| 2015/0380782 A1 * | 12/2015 | Youngs | ............... | H01M 10/625 429/72 |
| 2016/0178246 A1 * | 6/2016 | Toyooka | ................ | F25B 7/00 62/335 |
| 2016/0282023 A1 * | 9/2016 | Matsunaga | ............. | F28D 15/06 |
| 2017/0064862 A1 * | 3/2017 | Miyoshi | ............ | H01L 21/67109 |
| 2017/0192365 A1 * | 7/2017 | Kemper | ................ | G03B 27/52 |
| 2017/0196124 A1 * | 7/2017 | Peng | ..................... | F28D 15/0266 |
| 2017/0248377 A1 * | 8/2017 | De Falco | ............. | F28D 1/0472 |
| 2017/0280585 A1 * | 9/2017 | Shoujiguchi | ........ | H05K 7/20127 |
| 2018/0058735 A1 * | 3/2018 | Takayama | ............... | F04B 39/00 |
| 2018/0241102 A1 * | 8/2018 | Kim | ........................ | H01M 2/10 |

* cited by examiner

LIQUID COOLING DEVICE, LIQUID COOLING SYSTEM, AND CONTROL METHOD OF LIQUID COOLING DEVICE

CROSS-REFERENCE TO RELATED APPLICATION

This application is based upon and claims the benefit of priority of the prior Japanese Patent Application No. 2016-145562, filed on Jul. 25, 2016, the entire contents of which are incorporated herein by reference.

FIELD

The embodiments discussed herein are related to a liquid cooling device, a liquid cooling system, and a control method of a liquid cooling device.

BACKGROUND

There have been liquid cooling devices that cool electronic components in a state where the electronic components are immersed in a refrigerant in a cooling medium bath (for example, see Japanese Laid-open Patent Publication No. 6-169039 and Japanese National Publication of International Patent Application No. 2011-518395).

Further, there have been liquid cooling devices that cool electronic components which are immersed in a refrigerant in a cooling medium bath by a water-cooling jacket.

In an above liquid cooling device, piping that supplies cooling water to a water-cooling jacket is immersed in a refrigerant in a cooling medium bath. Further, the refrigerant in the cooling medium bath is cooled by the cooling water that flows in the piping.

However, there is room for further improvement on cooling of the refrigerant in the cooling medium bath.

SUMMARY

According to an aspect of the embodiments, a liquid cooling device includes: a cooling medium bath configured to house a first refrigerant in which an electronic device is immersed; a liquid-cooling jacket configured to be provided to the electronic device and to cool the electronic device by a second refrigerant that flows in an internal section of the liquid-cooling jacket; a first pipe coupled to the cooling medium bath, to be immersed in the first refrigerant, and configured to supply the second refrigerant from an outside of the cooling medium bath to the liquid-cooling jacket; a second pipe coupled to the cooling medium bath, to be immersed in the first refrigerant, and configured to discharge the second refrigerant that flows in the internal section of the liquid-cooling jacket to the outside of the cooling medium bath; and a circulator configured to cause the first refrigerant in the cooling medium bath to stream.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A first embodiment of the techniques disclosed by the present application will hereinafter be described.

Rack

Figure 1:
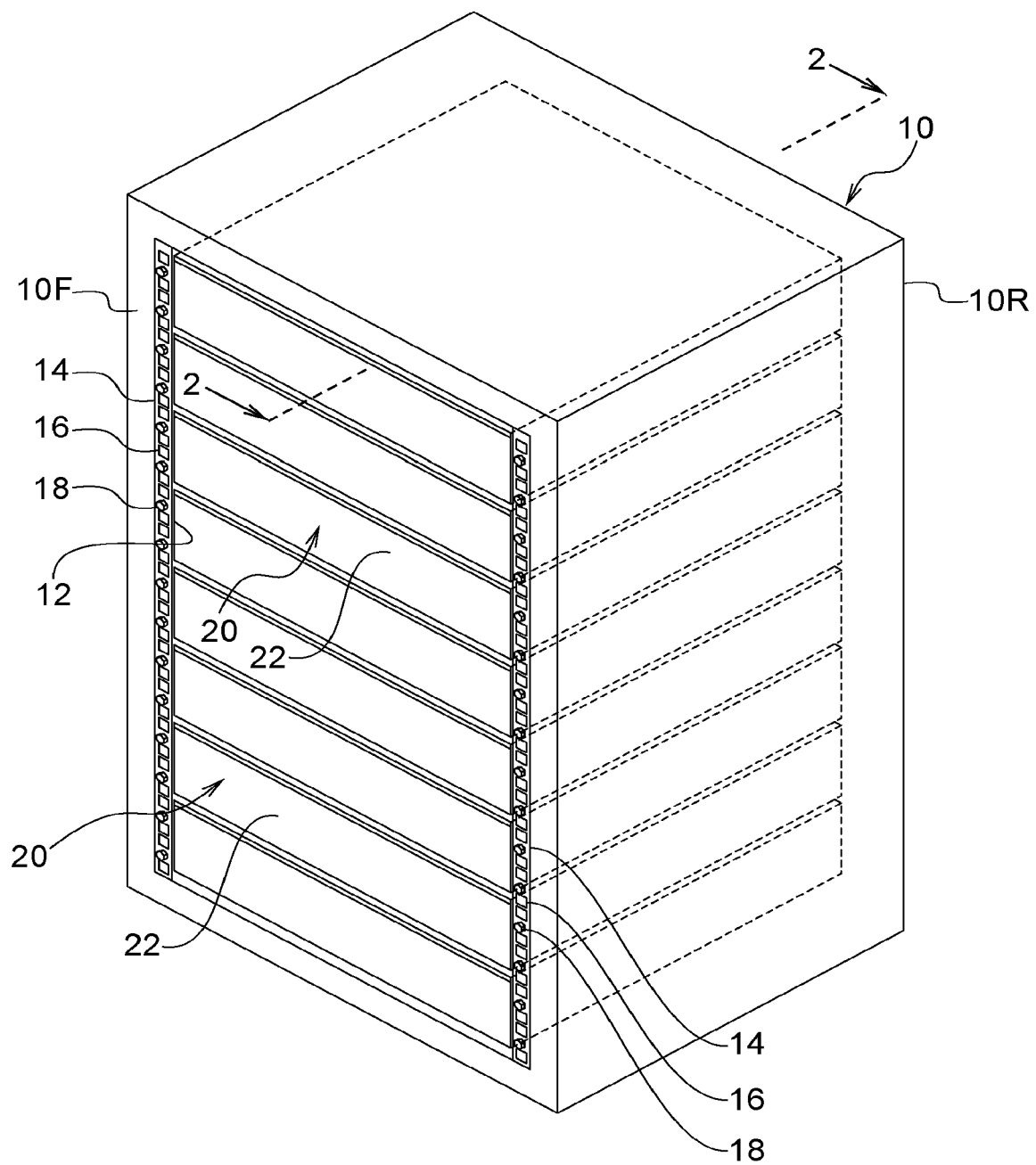
FIG. 1 is a perspective diagram that illustrates a rack that houses a liquid cooling device according to a first embodiment.

As illustrated in FIG. 1, a liquid cooling device 20 according to a first embodiment is housed in a rack 10. The rack 10 houses plural liquid cooling devices 20 in the height direction of the rack 10. The rack 10 is formed into a box shape. Further, a housing opening 12 for housing the liquid cooling device 20 is formed on a front 10F side of the rack 10. In addition, a pair of support pillars 14 is provided on both sides of the housing opening 12 of the rack 10.

Plural mounting holes 16 are formed in each of the support pillars 14. The plural mounting holes 16 are aligned in the longitudinal direction of the support pillar 14. A fixing tool 18 such as a bolt may be inserted in each of the mounting holes 16. A casing 22 of the liquid cooling device 20, which will be described later, is fixed to each of the pair of support pillars 14 by the fixing tools 18.

A pair of support pillars, which is not illustrated, is provided on a rear 10R side of the rack 10. The pair of support pillars has the similar configuration to the pair of support pillars 14. The casing 22 of the liquid cooling device 20 is fixed to the pair of support pillars by fixing tools, which are not illustrated.

Liquid Cooling Device

Figure 2:
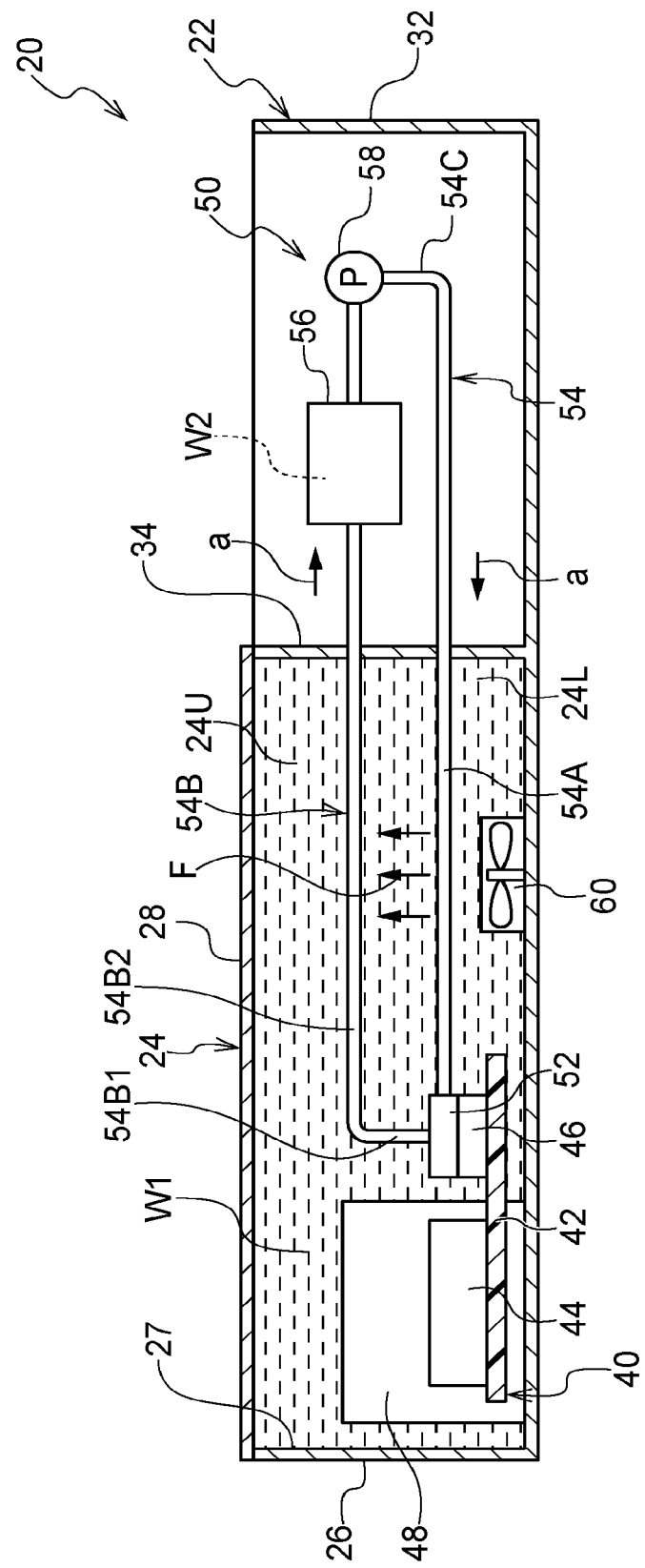
FIG. 2 is a cross-sectional diagram taken along line 2-2 in FIG. 1.

As illustrated in FIG. 2, the liquid cooling device 20 is a device for cooling an information processing device 40, which will be described later. The liquid cooling device 20 includes the casing 22, a liquid-cooling unit 50 and a liquid-current generator 60. In this embodiment, the liquid cooling device 20 and the information processing device 40 configure a liquid cooling system.

The casing 22 has a cooling medium bath 24 and an equipment chamber 32. The cooling medium bath 24 and the equipment chamber 32 are adjacently arranged across a wall 34. That is, the wall 34 serves as a partition wall for partitioning the cooling medium bath 24 from the equipment chamber 32.

The cooling medium bath 24 is a sealed container (watertight container) that houses a first refrigerant W1. The cooling medium bath 24 has a bath main body 26 and a lid 28. The bath main body 26 is a box-shaped container that is open in an upper section. A housing opening 27 is formed at an upper end of the bath main body 26.

The lid 28 of the casing 22 is formed into a flat plate shape. The housing opening 27 of the bath main body 26 is opened or closed by the lid 28. Further, a sealing material, which is not illustrated, is provided in a periphery of the housing opening 27 of the bath main body 26. This sealing material seals a gap between the lid 28 and the periphery of the housing opening 27.

The first refrigerant W1 is housed (stored) in the cooling medium bath 24. The first refrigerant W1 is housed through the housing opening 27 in the bath main body 26. Further, the first refrigerant W1 is an inactive liquid (liquid refrigerant) that is electrically insulating and thermally conducting. As the first refrigerant W1, for example, an inactive fluorine-based liquid (for example, Fluorinert™, Novec™, or the like) is used.

Electronic Device

The information processing device 40 is housed in the cooling medium bath 24. The information processing device 40 is housed through the housing opening 12 in the cooling medium bath 24. The information processing device 40 is housed in the cooling medium bath 24 in a state where the information processing device 40 is immersed in the first refrigerant W1.

The information processing device 40 has a substrate 42 and a power source unit 48. The substrate 42 is a rectangular printed circuit substrate, for example. A low heat generation electronic component 44 and a high heat generation electronic component 46 are mounted on the substrate 42. Each of the high heat generation electronic component 46 and the low heat generation electronic component 44 generates heat by consuming power. The power source unit 48 is electrically connected with the substrate 42. The power source unit 48 supplies power to the substrate 42, for example.

Here, for example, a semiconductor storage device or the like such as a memory is included in the low heat generation electronic component 44. Meanwhile, for example, an arithmetic processing device or the like such as a central processing unit (CPU) is included in the high heat generation electronic component 46. The high heat generation electronic component 46 generates a higher heat amount per unit time than the low heat generation electronic component 44. Further, the high heat generation electronic component 46 is provided with a liquid-cooling jacket 52, which will be described later. Note that the low heat generation electronic component 44 and the high heat generation electronic component 46 are examples of electronic components. The information processing device and the electronic components are included in an electronic device. That is, the electronic device is based on a concept that the electronic device includes not only the information processing device but also the electronic components such as the semiconductor storage device and the arithmetic processing device.

Liquid-Cooling Unit

The high heat generation electronic component 46 is cooled by the liquid-cooling unit 50. The liquid-cooling unit 50 has the liquid-cooling jacket 52, a refrigerant condenser 56, and second refrigerant circulating piping 54, and a pump 58.

The liquid-cooling jacket 52 is a liquid-cooling heat sink that is attached to the high heat generation electronic component 46, for example. The liquid-cooling jacket 52 performs heat exchange between a second refrigerant W2 supplied from the refrigerant condenser 56 via the second refrigerant circulating piping 54 and the high heat generation electronic component 46 and thereby cools the high heat generation electronic component 46. Note that two arrows "a" indicated in FIG. 2 indicate the flow of the second refrigerant W2.

Specifically, the liquid-cooling jacket 52 is housed in the cooling medium bath 24 in a state where the liquid-cooling jacket 52 is immersed in the first refrigerant W1. Further, the liquid-cooling jacket 52 is arranged above the high heat generation electronic component 46 so as to be capable of heat exchange with the high heat generation electronic component 46. The liquid-cooling jacket 52 is fixed to the substrate 42 by a screw or the like, which is not illustrated, for example.

The liquid-cooling jacket 52 has an internal flow path, which is not illustrated. The second refrigerant W2 is supplied to the internal flow path via the second refrigerant circulating piping 54. The second refrigerant circulating piping 54 has supply piping 54A, discharge piping 54B, and connection piping 54C. The supply piping 54A, the discharge piping 54B, and the connection piping 54C are formed of thermally conducting metal pipes such as copper or stainless steel, for example.

The supply piping 54A is arranged in a lower section 24L of the cooling medium bath 24 in a state where the supply piping 54A is immersed in the first refrigerant W1. The supply piping 54A is arranged laterally. The supply piping 54A extends from a side surface of the liquid-cooling jacket 52 toward the wall 34 side and passes through the wall 34. A gap between the wall 34 and the supply piping 54A is sealed by a sealing material, which is not illustrated.

The discharge piping 54B is arranged in an upper section 24U of the cooling medium bath 24 in a state where the discharge piping 54B is immersed in the first refrigerant W1. The discharge piping 54B has a vertical pipe 54B1 and a lateral pipe 54B2. The vertical pipe 54B1 is arranged vertically. The vertical pipe 54B1 extends upward from an upper surface of the liquid-cooling jacket 52.

Meanwhile, the lateral pipe 54B2 is arranged laterally. The lateral pipe 54B2 extends from an upper end of the vertical pipe 54B1 toward the wall 34 side and passes through the wall 34. Further, the lateral pipe 54B2 is arranged above the supply piping 54A. In other words, the supply piping 54A is arranged below the lateral pipe 54B2 of the discharge piping 54B. The connection piping 54C is connected with the lateral pipe 54B2. A gap between the wall 34 and the discharge piping 54B is sealed by a sealing material, which is not illustrated.

The connection piping 54C is arranged in the equipment chamber 32. That is, the connection piping 54C is provided outside the cooling medium bath 24. The connection piping 54C connects the discharge piping 54B and the supply piping 54A together. Further, the connection piping 54C is provided with the refrigerant condenser 56.

The refrigerant condenser 56 is a freezing machine or a cooling tower (chiller) that cools the second refrigerant W2 that flows through the connection piping 54C. Further, the connection piping 54C is provided with the pump 58. The pump 58 is actuated to deliver the second refrigerant W2 in the connection piping 54C to the supply piping 54A. The pump 58 circulates the second refrigerant W2 through the second refrigerant circulating piping 54 in the arrow "a" directions. The arrangement of the pump 58 may appropriately be changed.

Here, the second refrigerant W2 is a liquid (liquid refrigerant) with higher thermal conductivity than the first refrigerant W1. As the second refrigerant W2, for example, water, glycerin, ethylene glycol, acetic acid, olive oil, silicone oil, spindle oil, ether, or the like is used.

Liquid-Current Generator

The cooling medium bath 24 is provided with the liquid-current generator 60. The liquid-current generator 60 is housed in the lower section 24L of the cooling medium bath 24 in a state where the liquid-current generator 60 is immersed in the first refrigerant W1. The liquid-current generator 60 is an under-liquid pump (underwater pump) or an under-liquid fan (underwater fan) that sends out the first refrigerant W1 in a prescribed direction, for example.

The liquid-current generator 60 is arranged below the supply piping 54A and the lateral pipe 54B2 of the discharge piping 54B. Further, the liquid-current generator 60 is arranged to have the streaming direction (sending-out direction) of the first refrigerant W1 as the upward direction. In a case where the liquid-current generator 60 is actuated, as indicated by arrow "F", the first refrigerant W1 in the cooling medium bath 24 streams, and the first refrigerant W1 is stirred.

Next, functions of the first embodiment will be described.

As illustrated in FIG. 2, in the first embodiment, the liquid cooling device 20 includes the cooling medium bath 24 that houses the first refrigerant W1. The information processing device 40 is immersed in the first refrigerant W1 in the cooling medium bath 24. Consequently, the first refrigerant W1 cools the substrate 42 of the information processing device 40, the low heat generation electronic component 44, the high heat generation electronic component 46, and the power source unit 48.

Further, the liquid cooling device 20 includes the liquid-cooling unit 50. The liquid-cooling unit 50 has the liquid-cooling jacket 52, the refrigerant condenser 56, and the second refrigerant circulating piping 54, and the pump 58. In a case where the pump 58 is actuated, the second refrigerant W2 cooled by the refrigerant condenser 56 is supplied to the internal flow path of the liquid-cooling jacket 52 via the connection piping 54C and the supply piping 54A. Then, heat exchange is performed between the second refrigerant W2 that flows through the internal flow path of the liquid-cooling jacket 52 and the high heat generation electronic component 46, and the high heat generation electronic component 46 is thereby cooled.

The second refrigerant W2 that flows through the internal flow path of the liquid-cooling jacket 52 is supplied to the refrigerant condenser 56 via the discharge piping 54B and the connection piping 54C and is cooled by the refrigerant condenser 56. As described above, the second refrigerant W2 cooled by the refrigerant condenser 56 is supplied to the internal flow path of the liquid-cooling jacket 52 via the connection piping 54C and the supply piping 54A by the pump 58. That is, the second refrigerant W2 is circulated between the refrigerant condenser 56 and the liquid-cooling jacket 52. Consequently, the high heat generation electronic component 46 may continuously be cooled by the second refrigerant W2 cooled by the refrigerant condenser 56.

In addition, the supply piping 54A and the discharge piping 54B are immersed in the first refrigerant W1 in the cooling medium bath 24. The second refrigerant W2 that flows in the supply piping 54A and the discharge piping 54B performs heat exchange with the first refrigerant W1, and the first refrigerant W1 is thereby cooled. Accordingly, the cooling efficiency of the information processing device 40 is enhanced.

In addition, the liquid cooling device 20 is provided with the liquid-current generator 60. In a case where the liquid-current generator 60 is actuated, as indicated by arrow "F" in FIG. 2, the first refrigerant W1 in the cooling medium bath 24 streams upward, and the first refrigerant W1 is stirred. Consequently, heat exchange between the second refrigerant W2 that flows in the supply piping 54A and the discharge piping 54B and the first refrigerant W1 is promoted. That is, in a control method of the liquid cooling device according to this embodiment, while the liquid-current generator 60 causes the first refrigerant W1 in the cooling medium bath 24 to stream, the first refrigerant W1 is cooled by the second refrigerant W2 that flows in the supply piping 54A and the discharge piping 54B. Accordingly, the cooling efficiency of the first refrigerant W1 is enhanced.

Further, as indicated by arrow "F", the liquid-current generator 60 causes the first refrigerant W1 to stream upward. That is, the liquid-current generator 60 causes the first refrigerant W1 to stream toward the supply piping 54A and the discharge piping 54B. Consequently, heat exchange between the second refrigerant W2 that flows in the supply piping 54A and the discharge piping 54B and the first refrigerant W1 is further promoted.

In addition, the liquid-current generator 60 is arranged in the lower section 24L of the cooling medium bath 24. Here, in a case where the first refrigerant W1 is heated by the information processing device 40, the first refrigerant W1 rises, and convection occurs in the first refrigerant W1. Thus, the temperature of the first refrigerant W1 in the upper section 24U of the cooling medium bath 24 tends to become higher than the temperature of the first refrigerant W1 in the lower section 24L of the cooling medium bath 24.

Thus, in this embodiment, the liquid-current generator 60 causes the first refrigerant W1 in the lower section 24L of the cooling medium bath 24 to stream upward, and the temperature of the first refrigerant W1 in the upper section 24U of the cooling medium bath 24 is thereby lowered. Consequently, the cooling efficiency of the first refrigerant W1 is further enhanced.

Further, the supply piping 54A and the discharge piping 54B are formed of metal pipes such as copper or stainless steel. Consequently, in this embodiment, compared to a case where the supply piping 54A and the discharge piping 54B are formed of resin pipes, the efficiency of heat exchange between the second refrigerant W2 and the first refrigerant W1 becomes high. Accordingly, the first refrigerant W1 may efficiently be cooled.

As described above, in this embodiment, while the high heat generation electronic component 46 is cooled by the second refrigerant W2 that flows through an internal section of the liquid-cooling jacket 52, the first refrigerant W1 is cooled by the second refrigerant W2 that flows in the supply piping 54A and the discharge piping 54B. Accordingly, the cooling efficiency of the information processing device 40 may be enhanced.

Further, in this embodiment, the high heat generation electronic component 46 that generates a higher heat amount between the low heat generation electronic component 44 and the high heat generation electronic component 46 is cooled by the liquid-cooling jacket 52. Accordingly, the information processing device 40 may efficiently be cooled.

In addition, the high heat generation electronic component 46 and so forth are cooled by the liquid-cooling jacket 52, and the amount of the first refrigerant W1 for cooling the information processing device 40 to a prescribed temperature or lower is thereby decreased. Further, a refrigerant such as water that is less expensive than the first refrigerant W1 and has higher thermal conductivity may be used as the second refrigerant W2. Accordingly, the costs for the first refrigerant W1 and the second refrigerant W2 may be reduced.

Further, the refrigerant condenser 56 is housed in the equipment chamber 32 of the liquid cooling device 20. Consequently, in this embodiment, compared to a case where the refrigerant condenser 56 is installed on the outside of the liquid cooling device 20, that is, the refrigerant condenser 56 is installed on the outside of the rack 10, the length of the connection piping 54C may be shortened. As a result, size reduction of the pump 58 may be intended.

In addition, the rack 10 is capable of housing the plural liquid cooling devices 20. Accordingly, the number of the liquid cooling devices 20 may easily be increased. Further, the plural liquid cooling devices 20 are aligned in the height direction of the rack 10. Accordingly, the installation space of the liquid cooling device 20 in the horizontal direction may be decreased.

It is possible to change the arrangement of the liquid-current generator 60 with respect to the cooling medium bath 24 and the streaming direction of the first refrigerant W1 of the liquid-current generator 60. Accordingly, for example, the liquid-current generator may be arranged in the lower section 24L of the cooling medium bath 24 in a state where the streaming direction of the first refrigerant W1 is set to the lateral direction or an oblique direction. Further, for example, the liquid-current generator may be arranged in the upper section 24U of the cooling medium bath 24 in a state where the streaming direction of the first refrigerant W1 is set to a downward direction.

Further, the liquid-current generator 60 may be arranged to have the streaming direction of the first refrigerant W1 toward the supply piping 54A or the discharge piping 54B or the combination thereof. In addition, the liquid-current generator 60 may be arranged to have the streaming direction of the first refrigerant W1 not toward the supply piping 54A or the discharge piping 54B.

Next, a second embodiment will be described. Note that in the second embodiment, members and so forth in the same configurations as the first embodiment are provided with the same reference characters as the first embodiment, and a description thereof will not be made.

Liquid Cooling Device

Figure 3:
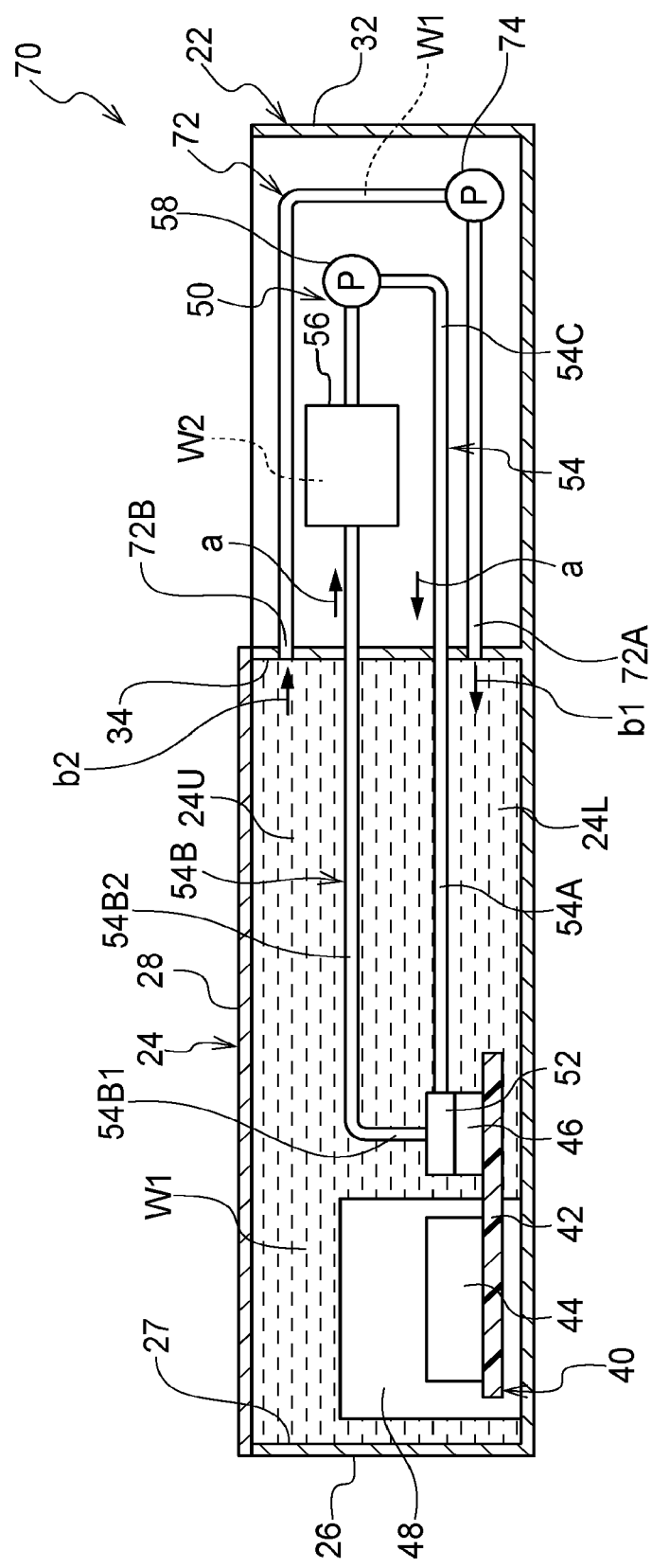
FIG. 3 is a cross-sectional diagram that illustrates a liquid cooling device according to a second embodiment and corresponds to FIG. 2.

As illustrated in FIG. 3, a liquid cooling device 70 according to the second embodiment has a first refrigerant circulating piping 72 and a streaming pump 74.

First Refrigerant Circulating Piping

The first refrigerant circulating piping 72 is circulating piping that circulates the first refrigerant W1 in the cooling medium bath 24. The first refrigerant circulating piping 72 is housed in the equipment chamber 32 of the casing 22. Further, one end 72A of the first refrigerant circulating piping 72 is connected with the lower section 24L of the cooling medium bath 24. Meanwhile, the other end 72B of the first refrigerant circulating piping 72 is connected with the upper section 24U of the cooling medium bath 24.

More specifically, the one end 72A of the first refrigerant circulating piping 72 is connected with the wall 34 of the cooling medium bath 24 below the supply piping 54A and the discharge piping 54B. Meanwhile, the other end 72B of the first refrigerant circulating piping 72 is connected with the wall 34 of the cooling medium bath 24 above the supply piping 54A and the discharge piping 54B.

A gap between the first refrigerant circulating piping 72 and the wall 34 is sealed by a sealing material or the like, which is not illustrated.

Streaming Pump

As illustrated in FIG. 3, the first refrigerant circulating piping 72 is provided with the streaming pump 74. The streaming pump 74 is an under-liquid pump (underwater pump) that is actuated to send out the first refrigerant W1 in the first refrigerant circulating piping 72 to the one end 72A of the first refrigerant circulating piping 72. In a case where the streaming pump 74 is actuated, the first refrigerant W1 in the cooling medium bath 24 is circulated via the first refrigerant circulating piping 72.

Next, functions of the second embodiment will be described.

As illustrated in FIG. 3, in a case where the streaming pump 74 is actuated, as indicated by arrow "b1", the first refrigerant W1 in the first refrigerant circulating piping 72 is supplied to the lower section 24L of the cooling medium bath 24 via the one end 72A of the first refrigerant circulating piping 72. Meanwhile, as indicated by arrow "b2", the first refrigerant W1 in the upper section 24U of the cooling medium bath 24 is supplied to the other end 72B of the first refrigerant circulating piping 72. Consequently, the first refrigerant W1 in the cooling medium bath 24 is circulated via the first refrigerant circulating piping 72. That is, the first refrigerant W1 in the cooling medium bath 24 streams. As a result, heat exchange between the first refrigerant W1 in the cooling medium bath 24 and the second refrigerant W2 that flows in the supply piping 54A and the discharge piping 54B is promoted. Accordingly, the cooling efficiency of the first refrigerant W1 is enhanced.

Further, the one end 72A of the first refrigerant circulating piping 72 is connected with the cooling medium bath 24 below the supply piping 54A and the discharge piping 54B. Meanwhile, the other end 72B of the first refrigerant circulating piping 72 is connected with the cooling medium bath 24 above the supply piping 54A and the discharge piping 54B.

This facilitates heat exchange between the first refrigerant W1 that is supplied from the one end 72A of the first refrigerant circulating piping 72 to the cooling medium bath 24 and the supply piping 54A and the discharge piping 54B. Accordingly, the cooling efficiency of the first refrigerant W1 is further enhanced.

Further, as described above, in a case where the first refrigerant W1 is heated by the information processing device 40, the first refrigerant W1 rises, and convection occurs in the first refrigerant W1. Thus, the temperature of the first refrigerant W1 in the upper section 24U of the cooling medium bath 24 tends to become higher than the temperature of the first refrigerant W1 in the lower section 24L of the cooling medium bath 24.

However, in this embodiment, the first refrigerant W1 in the upper section 24U of the cooling medium bath 24 is supplied to the lower section 24L of the cooling medium bath 24 via the first refrigerant circulating piping 72. The first refrigerant W1 supplied to the lower section 24L of the cooling medium bath 24 performs heat exchange with the second refrigerant W2 that flows in the supply piping 54A and the discharge piping 54B and is thereby cooled. Accordingly, in this embodiment, compared to a case where both of the one end 72A and the other end 72B of the first refrigerant circulating piping 72 are connected with the upper section 24U or the lower section 24L of the cooling medium bath 24, the cooling efficiency of the first refrigerant W1 is enhanced.

The streaming pump 74 may be provided to the first refrigerant circulating piping 72 so as to send out the first refrigerant W1 in the first refrigerant circulating piping 72 to the other end 72B of the first refrigerant circulating piping 72.

Further, it is possible to change the connection positions of the one end 72A and the other end 72B of the first refrigerant circulating piping 72 with respect to the cooling medium bath 24. Consequently, for example, both of the one end 72A and the other end 72B of the first refrigerant circulating piping 72 may be connected with the lower section 24L of the cooling medium bath 24, or both of the one end 72A and the other end 72B of the first refrigerant circulating piping 72 may be connected with the upper section 24U of the cooling medium bath 24.

Further, the one end 72A and the other end 72B of the first refrigerant circulating piping 72 may extend into the cooling medium bath 24.

Further, the first refrigerant circulating piping 72 may be provided with a refrigerant condenser for cooling the first refrigerant W1 that flows in the first refrigerant circulating piping 72.

Next, common modification examples to the first and second embodiments will be described. Various kinds of modification examples will be described below with the first embodiment as an example. However, it is possible to appropriately apply those modification examples to the second embodiment.

In the above first embodiment, the high heat generation electronic component 46 is provided with the liquid-cooling jacket 52. However, the liquid-cooling jacket 52 may be provided to an electronic component such as the low heat generation electronic component 44, the power source unit 48, or an HDD.

Further, in the above first embodiment, the second refrigerant W2 is supplied from the discharge piping 54B to the refrigerant condenser 56. However, the second refrigerant W2 may be supplied from another supply source than the discharge piping 54B to the refrigerant condenser 56. In addition, for example, in a case where the temperature of the second refrigerant W2 that is supplied from the supply source of the second refrigerant W2 is lower than a prescribed value, it is possible to omit the refrigerant condenser 56.

Further, in the above first embodiment, the pump 58 supplies the second refrigerant W2 to the supply piping 54A. However, for example, the second refrigerant W2 may be supplied not from the pump 58 but from a storage bath that is installed in a higher position than the cooling medium bath 24 to the supply piping 54A.

Further, in the above first embodiment, the thermal conductivity of the second refrigerant W2 is set higher than the thermal conductivity of the first refrigerant W1. However, the thermal conductivity of the second refrigerant W2 may be equal to or lower than the thermal conductivity of the first refrigerant W1.

Further, the liquid cooling device 20 of the above first embodiment may cool various electronic devices such as a server device, a storage device, and a communication device. Further, the cooling medium bath 24 may house at least one electronic device.

Further, the first refrigerant circulating piping 72 and the streaming pump 74 of the second embodiment may be combined with the liquid cooling device 20 according to the above first embodiment.

Further, the liquid cooling device 20 of the first embodiment is housed in the rack 10. However, the liquid cooling device may be installed on a floor or the like, for example.

Analysis

Next, a description will be made about an analysis of cooling performance of the liquid cooling device.

In this analysis, the cooling performance of a liquid cooling device according to an embodiment and the cooling performance of a liquid cooling device according to a comparative example were analyzed.

(Liquid Cooling Device According to Embodiment)

Figure 4:
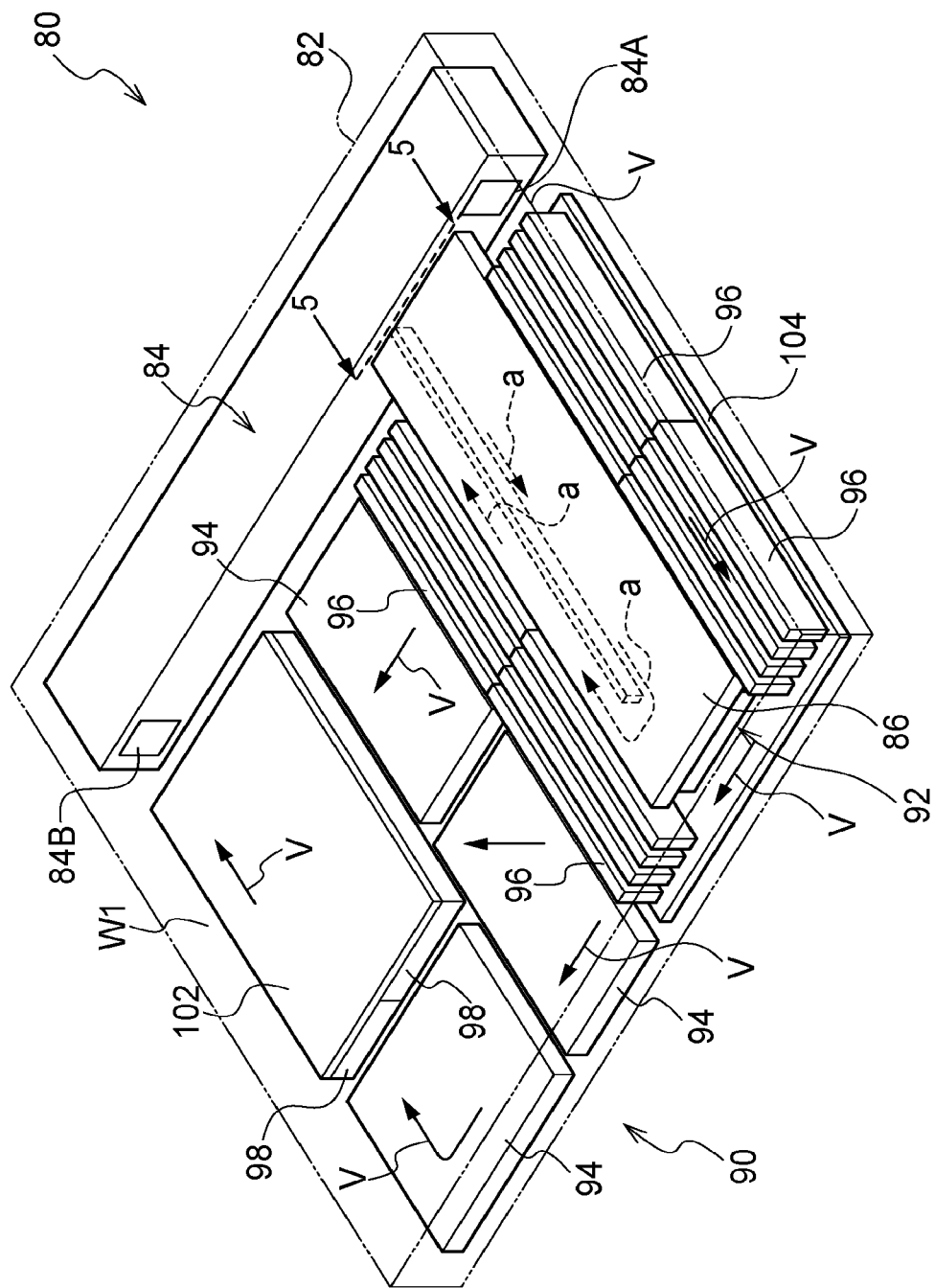
FIG. 4 is a perspective diagram that illustrates an analytical model of a liquid cooling device according to an embodiment.
Figure 5:
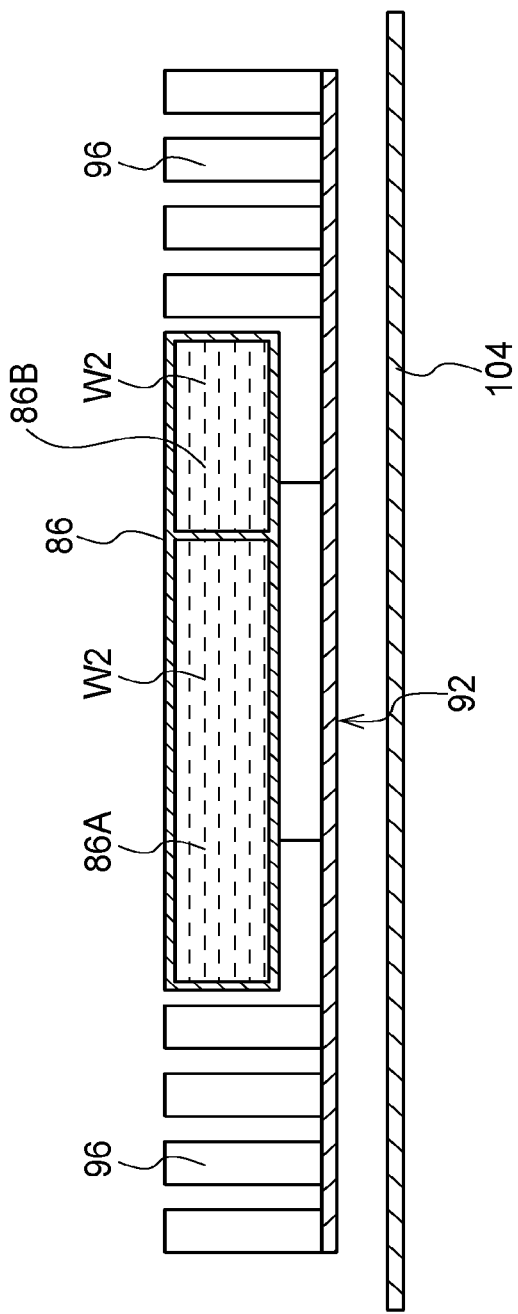
FIG. 5 is a cross-sectional diagram taken along line 5-5 in FIG. 4.

As illustrated in FIG. 4 and FIG. 5, an analytical model of a liquid cooling device 80 according to the embodiment includes a cooling medium bath 82, a refrigerant circulator 84, and a liquid-cooling jacket 86. The first refrigerant W1 is housed in the cooling medium bath 82. The refrigerant circulator 84 has a supply port 84A that supplies the first refrigerant W1 to the cooling medium bath 82 and a discharge port 84B that collects the first refrigerant W1 discharged from the cooling medium bath 82. Note that arrows "V" indicated in FIG. 4 indicate the flow of the first refrigerant W1.

Further, as illustrated in FIG. 5, the refrigerant circulator 84 supplies the second refrigerant W2 to a supply port 86A of the liquid-cooling jacket 86 and collects the second refrigerant W2 discharged from the liquid-cooling jacket 86 through a discharge port 86B. Note that the refrigerant circulator 84 is one example of a circulator. Further, three arrows "a" indicated in FIG. 4 indicate the flow of the second refrigerant W2.

As illustrated in FIG. 4, an electronic device 90 is housed in the cooling medium bath 82. The electronic device 90 is immersed in the first refrigerant W1. The electronic device 90 has a central processing unit (CPU) module 92 as the arithmetic processing device, a hard disk drive (HDD) 94, a dual inline memory module (DIMM) 96 as the memory, a power supply unit (PSU) 98 as a power source unit, an interface (I/F) card 102 as an input-output card, a system board (substrate) 104, and a RAID card, which is not illustrated.

Liquid Cooling Device According to Comparative Example

Figure 6:
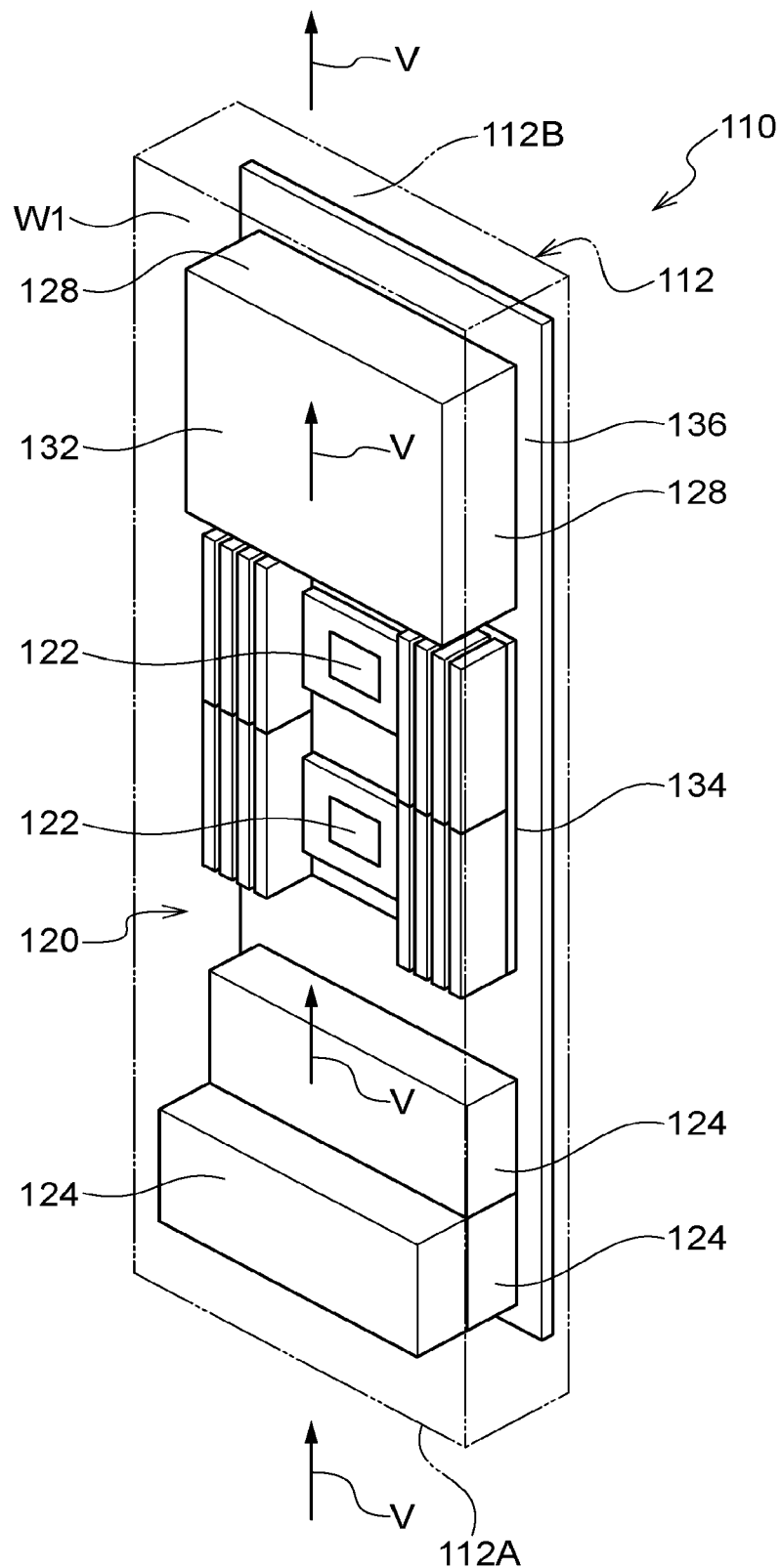
FIG. 6 is a perspective diagram that illustrates an analytical model of a liquid cooling device according to a comparative example.

As illustrated in FIG. 6, an analytical model of a liquid cooling device 110 according to the comparative example includes a cooling medium bath 112. The first refrigerant W1 is housed in the cooling medium bath 112. Further, the cooling medium bath 112 has a supply port 112A to which the first refrigerant W1 is supplied and a discharge port 112B that discharges the first refrigerant W1. Note that arrows "V" indicated in FIG. 6 indicate the flow of the first refrigerant W1.

An electronic device 120 is housed in the cooling medium bath 112. The electronic device 120 is immersed in the first refrigerant W1. The electronic device 120 has a CPU module 122, an HDD 124, a DIMM 126, a PSU 128, an I/F card 132, a system board 134, a chassis 136, and a RAID card, which is not illustrated.

Table 1 represents details of common components to the liquid cooling devices 80 and 110 according to the embodiment and the comparative example, respectively. Further, table 2 represents details of specific components of the liquid cooling device 80 according to the embodiment. Further, table 3 represents details of specific components of the liquid cooling device 110 according to the comparative example. In addition, table 4 represents the heat generation amounts of various electronic components.

Further, table 5 represents the respective housed amounts (used amounts) of the first refrigerant W1 of the cooling medium baths 82 and 112 in the embodiment and the comparative example. Further, table 6 represents the physical properties of the first refrigerant W1 and the second refrigerant W2. As represented in table 6, each of the physical properties of the first refrigerant W1 is set as the physical property in a case where the temperature of the first refrigerant W1 is 25° C. Similarly, each of the physical properties of the second refrigerant W2 is set as the physical property in a case where the temperature of the second refrigerant W2 is 21° C. In addition, table 7 represents the set values of supply temperatures and so forth of the first refrigerant W1 and the second refrigerant W2.

Table 1 represents common components to liquid cooling devices according to embodiment and comparative example.

TABLE 1

| Name | Size (length × width × height) (mm) | Volume (mm³) | Number | Total volume (mm³) |
|---|---|---|---|---|
| CPU module | 160 × 300 × 29 | 1392000 | 1 | 1392000 |
| HDD | 147 × 102 × 26 | 389844 | 3 | 1169532 |
| System board | 160 × 336 × 2 | 107520 | 1 | 107520 |
| PSU | 205 × 38 × 76 | 592040 | 2 | 1184080 |
| RAID card | 139 × 160 × 2 | 44480 | 2 | 88960 |
| I/F card | 160 × 237 × 2 | 75840 | 1 | 75840 |
| | Total | | | 4017932 |

Table 2 represents specific components of liquid cooling device according to embodiment.

TABLE 2

| Name | Size (length × width × height) (mm) | Volume (mm³) | Number | Total volume (mm³) |
|---|---|---|---|---|
| Water-cooling jacket | 78 × 417 × 11 | 357786 | 1 | 357786 |

TABLE 2-continued

| Name | Size (length × width × height) (mm) | Volume (mm³) | Number | Total volume (mm³) |
|---|---|---|---|---|
| Supply port and discharge port of second refrigerant | 36 × 80 × 13 | 37400 | 1 | 37400 |
| | Total | | | 395186 |

Table 3 represents specific components of liquid cooling device according to comparative example.

TABLE 3

| Name | Size (length × width × height) (mm) | Volume (mm³) | Number | Total volume (mm³) |
|---|---|---|---|---|
| Chassis | 4 × 944 × 174 | 657024 | 1 | 657024 |
| | Total | | | 657024 |

Table 4 represents heat generation amounts of electronic components.

TABLE 4

| Electronic component | Heat generation amount (W) |
|---|---|
| CPU module | 100 |
| HDD | 3 |
| DIMM | 5 |

Table 5 represents housed amount (used amount) of first refrigerant.

TABLE 5

| | Cooling medium bath Size (length × width × height) (mm) | Volume (1) (mm³) | Total volume (2) of common components and specific components (mm³) | Housed amount of first refrigerant ((1) − (2)) (mm³) | Housed amount of first refrigerant ((1) − (2)) (L) |
|---|---|---|---|---|---|
| Embodiment | 470 × 484 × 49 | 11146520 | 4413118 | 6733362 | 6.73 |
| Comparative example | 180 × 67 × 1060 | 12783600 | 4674956 | 8108644 | 8.11 |

Table 6 represents physical properties of first refrigerant and second refrigerant.

TABLE 6

| Refrigerant | | Temperature (° C.) | Density (kg/m³) | Viscosity coefficient (kg/(m · s)) | Specific heat (J/(kg · K)) | Thermal conductivity (W/(m · K)) | Coefficient of cubic expansion (1/K) |
|---|---|---|---|---|---|---|---|
| First refrigerant | Inactive refrigerant | 25 | 1880 | 0.005264 | 1050 | 0.067 | 0.0012 |
| Second refrigerant | Water | 21 | 997.5 | 0.00098 | 4179 | 0.604 | 0.00021 |

Table 7 represents set values of first refrigerant and second refrigerant.

TABLE 7

| | First refrigerant | | Second refrigerant | | Surface temperature of liquid-cooling jacket (° C.) |
|---|---|---|---|---|---|
| | Supply temperature (° C.) | Supply flow rate (L/min) | Supply temperature (° C.) | Supply flow rate (L/min) | |
| Embodiment | 20 | 2 | 15 | 2 | 15 |
| Comparative example | 20 | 2 | — | — | — |

(Analysis Results)

Table 8 respectively represents analyzed temperatures of the CPUs (the CPU modules 92 and 122), the DIMMs 96 and 126, the HDDs 94 and 124, the discharge ports 84B and 112B of the first refrigerant W1, and the discharge port 86B of the second refrigerant W2 of the liquid cooling devices 80 and 110 according to the embodiment and the comparative example. As represented in table 8, the minimum values of the analyzed temperatures of the CPU (the CPU module 92), the DIMM 96, and the HDD 94 of the liquid cooling device 80 according to the embodiment are lower than those of the liquid cooling device 110 according to the comparative example.

Table 8 represents analyzed temperatures (° C.).

TABLE 8

| | CPU | DIMM | HDD | Discharge port of first refrigerant | Discharge port of second refrigerant |
|---|---|---|---|---|---|
| Embodiment | 19.6 to 22.7 | 19.3 to 22.4 | 19.5 to 21.2 | 19.5 to 20.1 | 17.8 to 18.8 |
| Comparative example | 29.3 to 37.8 | 21.8 to 27.4 | 20.1 to 20.6 | 25.8 to 26.3 | — |

Further, as represented in table 8, in the liquid cooling device 80 according to the embodiment, the minimum value of the temperature (19.5° C.) of the discharge port 84B of the first refrigerant W1 is lower than the supply temperature (20° C.) of the first refrigerant W1. It may be considered that this result is obtained because the first refrigerant W1 that streams in the cooling medium bath 82 is cooled by the second refrigerant W2 that flows in the liquid-cooling jacket 86.

Further, as represented in table 5, the housed amount of the first refrigerant W1 in the cooling medium bath 82 according to the embodiment is less than the housed amount of the first refrigerant W1 in the cooling medium bath 112 according to the comparative example. Based on this, it may be understood that in the liquid cooling device 80 according to the embodiment, while the cooling performance for the CPU (the CPU module 92), the DIMM 96, and the HDD 94 are secured, the used amount of the first refrigerant W1 is decreased.

Further, based on table 5, when calculating the ratio of the volume of the cooling medium bath 82 according to the embodiment to the volume of the cooling medium bath 112 according to the comparative example (the volume ratio=the volume of the cooling medium bath of the embodiment/the volume of the cooling medium bath of the comparative example), 87.2% is obtained. That is, the cooling medium bath 82 according to the embodiment is smaller than the cooling medium bath 112 according to the comparative example. Accordingly, in the liquid cooling device 80 according to the embodiment, size reduction of the liquid cooling device 80 may be intended compared to the liquid cooling device 110 according to the comparative example.

In the foregoing, the embodiments of the techniques disclosed by the present application have been described. However, the techniques disclosed by the present application are not limited to the above embodiments. Further, it is matter of course that the above embodiments and various modifications may be used by appropriately combining those and may be carried out in various modes without departing from the gist of the techniques disclosed by the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid cooling device, comprising:
 a cooling medium bath configured to house a first refrigerant in which an electronic device is directly immersed;
 a liquid-cooling jacket configured to be provided adjacent to the electronic device and to cool the electronic device by a second refrigerant that flows in an internal section of the liquid-cooling jacket, the second refrigerant being different from the first refrigerant and the second refrigerant having a higher thermal conductivity than the first refrigerant;

a first pipe configured to be provided the cooling medium bath, to be directly immersed in the first refrigerant, and to supply the second refrigerant from an outside of the cooling medium bath to the liquid-cooling jacket;

a second pipe configured to be provided to the cooling medium bath, to be directly immersed in the first refrigerant, and to discharge the second refrigerant that flows in the internal section of the liquid-cooling jacket to the outside of the cooling medium bath; and a circulator configured to cause the first refrigerant in the cooling medium bath to stream.

2. The liquid cooling device according to claim 1, wherein the circulator is provided in the cooling medium bath and has a liquid-current generator configured to cause the first refrigerant to stream.

3. The liquid cooling device according to claim 2, wherein the liquid-current generator causes the first refrigerant to stream toward the first pipe or the second pipe or a combination thereof.

4. The liquid cooling device according to claim 2, wherein the liquid-current generator is arranged in a lower section of the cooling medium bath and causes the first refrigerant to stream upward.

5. The liquid cooling device according to claim 2, wherein the first pipe and the second pipe are arranged above the liquid-current generator.

6. The liquid cooling device according to claim 1, wherein the circulator includes
 a first circulating pipe configured to have both ends thereof coupled with the cooling medium bath, and
 a streaming pump coupled to the first circulating pipe and configured to deliver the first refrigerant in the first circulating pipe to the cooling medium bath via one end of the first circulating pipe.

7. The liquid cooling device according to claim 6, wherein
the one end of the first circulating pipe is coupled with the cooling medium bath below the first pipe and the second pipe, and
the other end of the first circulating pipe is coupled with the cooling medium bath above the first pipe and the second pipe.

8. The liquid cooling device according to claim 6, wherein the other end of the first circulating pipe is coupled with the cooling medium bath above the one end of the first circulating pipe.

9. The liquid cooling device according to claim 1, wherein the first pipe and the second pipe include metal pipes.

10. The liquid cooling device according to claim 9, wherein the metal pipes are formed of copper or aluminium.

11. The liquid cooling device according to claim 1, further comprising:
a connection pipe configured to couple the second pipe and the first pipe together; and
a refrigerant condenser coupled to the connection pipe and configured to cool the second refrigerant that flows in the connection pipe.

12. The liquid cooling device according to claim 11, further comprising:
a pump coupled to the connection pipe and configured to deliver the second refrigerant in the connection pipe to the first pipe.

13. The liquid cooling device according to claim 11, wherein the first pipe, the second pipe, and the connection pipe form second circulating pipe configured to circulate the second refrigerant between the liquid-cooling jacket and the refrigerant condenser.

14. The liquid cooling device according to claim 1, wherein
the first pipe is arranged in a lower section of the cooling medium bath, and
the second pipe is arranged in an upper section of the cooling medium bath.

15. The liquid cooling device according to claim 1, wherein the first refrigerant is an inactive refrigerant configured to have electrical insulating properties.

16. The liquid cooling device according to claim 1, wherein the second refrigerant is water.

17. The liquid cooling device according to claim 1, wherein the liquid-cooling jacket is arranged above the electronic device.

18. A liquid cooling system, comprising:
an electronic device;
a cooling medium bath configured to house a first refrigerant in which the electronic device is directly immersed;
a liquid-cooling jacket coupled adjacent to the electronic device and configured to cool the electronic device by a second refrigerant that flows in an internal section of the liquid-cooling jacket, the second refrigerant being different from the first refrigerant and the second refrigerant having a higher thermal conductivity than the first refrigerant;
a first pipe coupled to the cooling medium bath, to be directly immersed in the first refrigerant, and configured to supply the second refrigerant from an outside of the cooling medium bath to the liquid-cooling jacket;
a second pipe coupled to the cooling medium bath, to be directly immersed in the first refrigerant, and configured to discharge the second refrigerant that flows in the internal section of the liquid-cooling jacket to the outside of the cooling medium bath; and
a circulator configured to cause the first refrigerant in the cooling medium bath to stream.

19. A control method of a liquid cooling device configured to include a cooling medium bath configured to house a first refrigerant in which an electronic device is directly immersed and a liquid-cooling jacket coupled adjacent to the electronic device and configured to cool the electronic device by a second refrigerant that flows in an internal section of the liquid-cooling jacket, the control method comprising:
supplying the second refrigerant from an outside of the cooling medium bath to the liquid-cooling jacket by a first pipe coupled to the cooling medium bath and configured to be directly immersed in the first refrigerant;
discharging the second refrigerant that flows in the internal section of the liquid-cooling jacket to the outside of the cooling medium bath by a second pipe coupled to the cooling medium bath and configured to be directly immersed in the first refrigerant; and
causing the first refrigerant in the cooling medium bath to stream by a circulator configured to be included in the liquid cooling device, wherein
the second refrigerant is different from the first refrigerant, and
the second refrigerant has a higher thermal conductivity than the first refrigerant.

* * * * *